United States Patent [19]

Kume et al.

[11] Patent Number: 4,996,571
[45] Date of Patent: Feb. 26, 1991

[54] NON-VOLATILE SEMICONDUCTOR MEMORY DEVICE ERASING OPERATION

[75] Inventors: Hitoshi Kume, Musashino; Yoshiaki Kamigaki, Tokorozawa; Tetsuo Adachi, Hachioji; Toshihisa Tsukada, Musashino; Kazuhiro Komori, Higashikurume; Toshiaki Nishimoto, Tama; Tadashi Muto, Iruma; Toshiko Koizumi, Kokubunji, all of Japan

[73] Assignees: Hitachi, Ltd., Tokyo; Hitachi Device Engineering Co., Ltd., Chiba, both of Japan

[21] Appl. No.: 375,956

[22] Filed: Jul. 6, 1989

[30] Foreign Application Priority Data

Jul. 8, 1988 [JP] Japan .................. 63-168855

[51] Int. Cl.$^5$ .............. H01L 29/68; G11C 11/34; G11C 7/00
[52] U.S. Cl. .................. 357/23.5; 365/185; 365/218
[58] Field of Search .......... 357/23.5; 365/185, 218

[56] References Cited

U.S. PATENT DOCUMENTS 4,742,492 3/1988 Smayling et al. ............ 365/218
4,797,856 1/1989 Lee et al. .................... 365/185

FOREIGN PATENT DOCUMENTS 54-43633 4/1979 Japan ........................ 365/218
276878 12/1987 Japan .

OTHER PUBLICATIONS

Yaron et al., "A 16K E$^2$PROM Employing New Array Architecture and Designed-In Reliability Features", IEEE Journal of Solid-State Circuits, vol. SC-17, No. 5, Oct. 1982, pp. 833-840.
Gee et al., "An Enhanced 16K E$^2$PROM", IEEE Journal of Solid-State Circuits, vol. SC-17, No. 5, Oct. 1982, pp. 828-832.

Primary Examiner—Rolf Hille
Assistant Examiner—Robert P. Limanek
Attorney, Agent, or Firm—Antonelli, Terry, Stout & Kraus

[57] ABSTRACT

The invention relates to a tunnel erasing device for a non-volatile semiconductor memory device comprising a source region and a drain region, a floating gate electrode having a part superposed on at least one of them through a gate insulating layer, and a control gate electrode disposed over the floating gate electrode through an interlayer insulating layer and is characterized as having a preliminary erasing operation in which a voltage is so applied to at least one of the source or drain region, with the control gate electrode grounded, that a relatively lower voltage than a predetermined voltage is applied preliminarily prior to applying thereto the predetermined voltage.

4 Claims, 9 Drawing Sheets

NON-VOLATILE SEMICONDUCTOR MEMORY DEVICE ERASING OPERATION

BACKGROUND OF THE INVENTION

This invention relates to a non-volatile semiconductor memory device which is electrically erasable and programmable and in particular to a non-volatile semiconductor memory device permitting an erasing operation having excellent controllability and reliability.

Heretofore, as non-volatile semiconductor memory devices, stored content of which can be rewritten, EPROM and E$^2$PROM are widely used. The EPROM and the E$^2$PROM have been characterized as having a high integration capacity and low cost accompanied thereby and by a high function (easiness of use) to rewrite electrically the stored content bit by bit (i.e. in the state where it is mounted in an apparatus) respectively. Demand for the non-volatile semiconductor memory device provided with both of these characteristics is great. A flash type E$^2$PROM is positioned as a device satisfying this requirement except that the electric rewriting function associated therewith is restricted to chip-erase (or block-erase) concerning erasing and a number of memory elements having new structures for realizing it are proposed and put to practical use.

An FAST (Floating Gate Asymmetric Source/Drain Tunnel Oxide) type device, furthermore, which is also known, is disclosed in JP-A-62-276878, for example. This memory element consists of a single field effect transistor with a floating gate and a control gate just as an FAMOS type memory element of EPROM and it is excellent in facilitating high density integration. Programming is effected by hot electron injection just as for the FAMOS type. On the other hand, electric chip-erase is effected by using the tunnel effect of electrons just as for the prior art E$^2$PROM. Concretely speaking, electrons stored in the floating gate electrode are emitted by the tunnel effect to the source region by applying a positive high voltage to the source region in the state where the control gate electrode and the semiconductor substrate are grounded. An electric field higher than 10 MV/cm applied to the gate oxide film between the floating gate electrode and the source region causes the tunnel effect.

The FAST type is characterized in that the region where electrons tunnel can be restricted to an extremely small area because the thickness of the gate oxide film under the floating gate electrode is reduced (to form a tunnel oxide layer) over the whole surface and the portion of the floating gate electrode superposed on the source region is formed by lateral diffusion of the same region in a self-aligned manner. As a result, even if the portion, where the floating gate electrode and the control gate electrode are superposed on each other, is formed consciously so as not to be great, it is possible to apply the voltage applied from a power supply to the tunnel oxide film with a high efficiency. That is, electric erase can be realized with a low power supply voltage without impairing the smallness of a cell.

Further, in an FAST type memory element, since the programming is effected on the drain side and the erase is effected on the source side, the junction profile of each of them is optimized separately. The drain region has an abrupt profile which causes an intensified electric field at the drain edge for raising the programming efficiency, while the source region has a graded profile which relaxes a maximum electric field at the source edge, to which a high voltage can be applied for the erasing operation. Such a structure is called an asymmetric source and drain structure.

On the other hand, IEEE J. of Solid-State Circuits, Vol. SC-17 (1982) pp 828–832 and IEEE J. of Solid-State Circuits, Vol. SC-17 (1982), pp 833–840 describe a method for applying the voltage when the rewriting operation is effected in an FLOTOX type memory element of E$^2$PROM. The peak value of the electric field applied to the thin tunnel oxide film is reduced not by applying instantaneously a predetermined driving voltage but by making the rise of the voltage slow, when the programming and erasing operation is effected. As a result, the stress in the oxide layer at rewriting is suppressed and improvement in the reliability is realized.

In the FAST type memory element, which is one of the prior art techniques described above, one important consideration involves how to suppress parasitic hole injection which takes place at the erasing operation.

In the FAST type memory element, parasitic leak current flows from the source to the semiconductor substrate at the erasing operation. This is due to the fact that among electrons and holes produced by a band-to-band tunneling at the surface of the source region overlapping the floating gate electrode, the holes flow out therefrom to the semiconductor substrate, because the gate oxide layer underneath the floating gate electrode is made uniformly thin, and it is an essential phenomenon. A part of above-mentioned holes flowing out are accelerated by a high electric field between the source and the semiconductor substrate to become hot holes, which are injected into the gate oxide layer. This is the hole injection mentioned beforehand. The injected holes cancel negative charge in the floating gate electrode and at the same time a part thereof is captured in the gate oxide layer to change the tunnel electric field for the electrons. As a result the erasing characteristics are modulated variously, depending on the degree of the injection and the capture of holes described above, which makes it impossible to control precisely the threshold voltages of all the memory cells at chip-erase. Further, since the holes in the gate oxide layer stated above are accumulated by repetition of the programming and erasing operation, their influences are strengthened with an increasing number of rewrite operations, which will be a factor to restrict the available number of rewrites.

On the contrary, in the FLOTOX type memory element of E$^2$PROM, since the tunnel region where the gate oxide layer is locally thinned is located within the surface portion of the high impurity concentration region, the generation of electron-hole pairs due to band-to-band tunneling is almost completely suppressed and therefore the above concern does not exist.

SUMMARY OF THE INVENTION

An object of this invention is to provide a non-volatile semiconductor memory device using FAST type memory elements described above, which is excellent in the controllability and the reliability for the erasing operation.

The object described above can be achieved by the fact that when a chip-erase operation is effected in the non-volatile semiconductor memory device using FAST type memory elements, a voltage lower than a predetermined erasing voltage (having the same polarity and a smaller absolute value) is applied, before the erasing voltage is applied, to the source region in each of the memory elements.

By using the means described above the desired objects can be realized by actions, which will be explained below.

When the erasing operation is effected in the non-volatile semiconductor memory device using FAST type memory elements, a so-called preliminary phase of the erase operation is effected by applying a voltage, that is lower than the predetermined erasing voltage, to the source region of the memory element before the predetermined erasing voltage is applied thereto. Since emission of electrons by the tunnel effect begins during this preliminary erase phase, it is possible to alleviate remarkably the instantaneous maximum electric field, which would otherwise be applied to the gate oxide layer (tunnel oxide layer) at the beginning of the erasing operation according to the prior art techniques. As a result the amount of the holes generated by band-to-band tunneling at the surface of the source region is reduced and thus it is possible to realize an erasing operation excellent in controllability and reliability.

DESCRIPTION OF THE PREFERRED EMBODIMENT

Hereinbelow the embodiment of this invention will be explained, referring to FIGS. 1(a) to 10.

At first, referring to FIGS. 4 and 5, the structure of the FAST type memory element used in this embodiment will be described.

Figure 4:
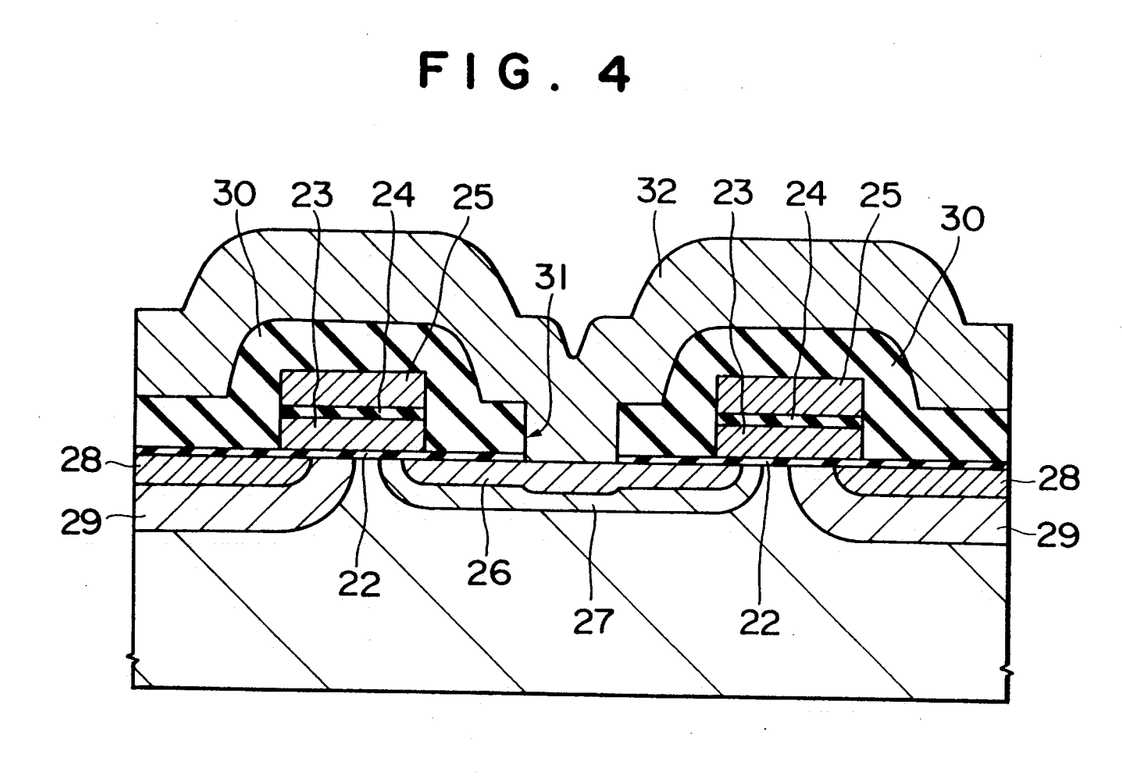
FIG. 4 is a cross-sectional view of FAST type memory elements for 2 bits used Embodiment.
Figure 5:
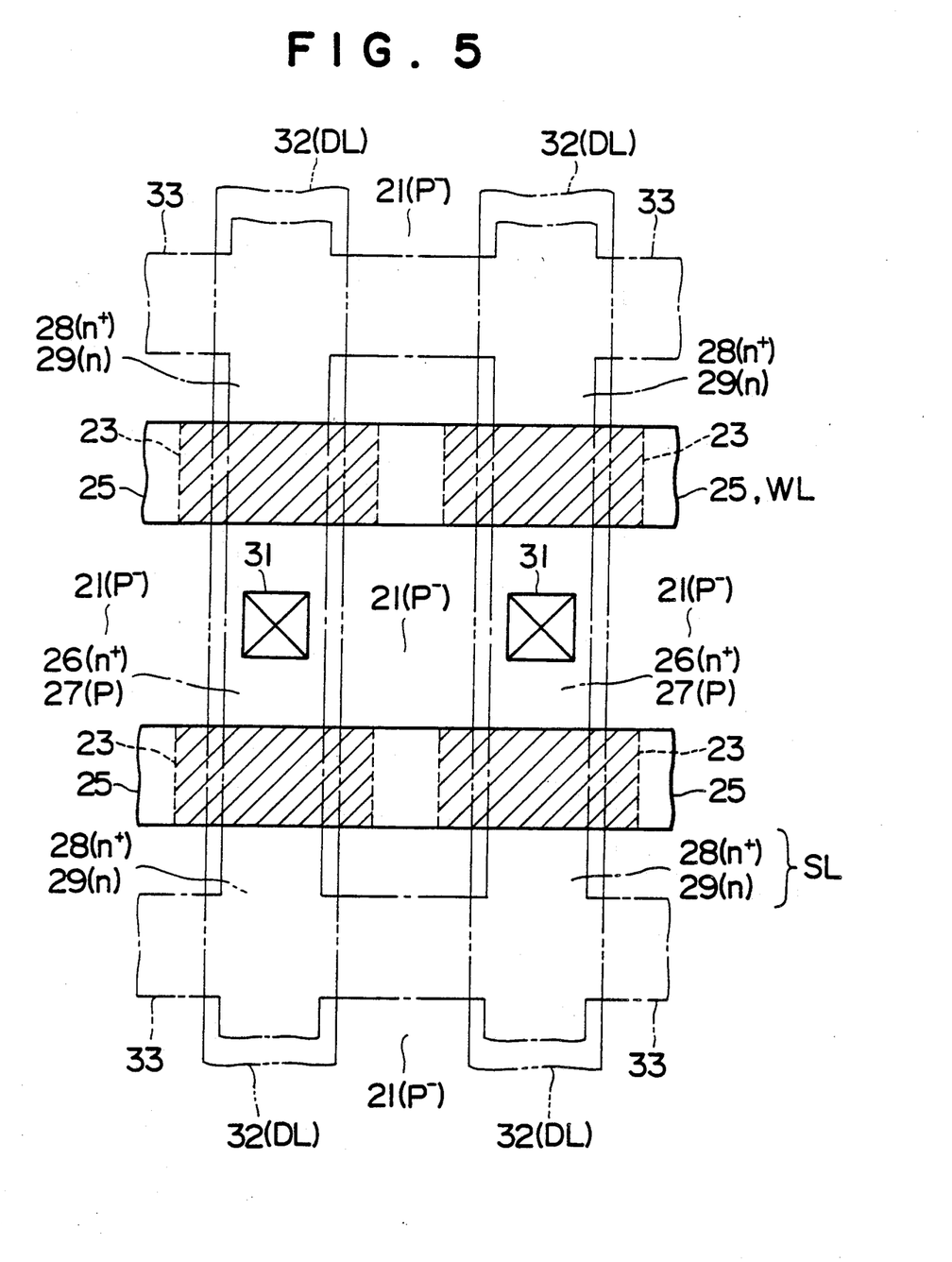
FIG. 5 is a plan view of the memory elements stated above for 4 bits.

In FIGS. 4 and 5, reference numeral 21 is a p− conductivity type semiconductor substrate; 22 is a thin gate oxide layer (tunnel oxide layer) formed on the principal surface of the p− conductivity type semiconductor substrate; 23 is a floating gate electrode; 24 is a first interlayer oxide layer; 25 is a control gate electrode; 26 is an n+ conductivity type semiconductor region (drain region); 27 is a p conductivity type semiconductor region (surrounding drain region); 28 is an n+ conductivity type semiconductor region (a part of the source region); 29 is an n conductivity type semiconductor region (a part of the source region); 30 is a second interlayer oxide layer; 31 is a contact hole; 32 is an aluminium data line; 33 is a boundary between an isolation region formed by the LOCOS method and the active region.

The gate oxide layer 22 is a silicon oxide layer formed by thermally oxidizing the surface of the semiconductor substrate 21 and the thickness of which is about 12 nm.

The first interlayer oxide layer 24 is a silicon oxide layer formed by thermally oxidizing the surface of the floating gate electrode 23 made of polycrystalline silicon and the thickness of which is about 25 nm.

The control gate electrode 25 is made of polycrystalline silicon, similarly to the floating gate electrode 23, and deposited on the surface of the first interlayer oxide layer and it acts so as to control the potential of the floating gate electrode 23 by an electrostatic capacitance coupling. The end portions in the channel direction of the control gate electrode 25 and the floating gate electrode 23 are formed simultaneously by one patterning step and the gates are about 1.2 μm long. Further the control gate electrode 25 is formed in one body with the word line WL, extending on the isolation region.

The drain region constituted by the n+ conductivity type semiconductor region 26 is connected with the data line 32 made of aluminium through the contact hole 31. The junction depth of the n+ conductivity type semiconductor region 26 is about 0.2 μm except for the part right under the contact hole 31. The junction depth under the contact hole 31 is greater than that under the other parts and it is about 0.3 μm.

The p conductivity type semiconductor region 27 is formed so as to surround this drain region and in this way, effect an increase of the channel hot electron injection efficiency at the writing operation and the punch-through prevention at the erasing operation are realized. The impurity concentration of the p conductivity type semiconductor region 27 is about $5 \times 10^{17}/cm^3$ at the junction interface with the n+ conductivity type semiconductor region 26 and the depth thereof is about 0.4 μm, measured from the surface of the semiconductor substrate 21.

The source region consists of the n+ conductivity type semiconductor region 28 and the n conductivity type semiconductor region 29 and it extends in the direction, in which the word line WL extends, constituting in this way the source line SL stated later.

The junction depth of the n+ conductivity type semiconductor region 28 is about 0.2 μm, similarly to region 26 of the drain region. The n conductivity type semiconductor region 29 is formed so as to be interposed between the n+ conductivity type semiconductor region 28 and the p− conductivity type semiconductor substrate 21 and it acts so as to increase the junction breakdown voltage between the source and the semiconductor substrate. The impurity concentration of the n conductivity type semiconductor region 29 is about $1 \times 10^{19}/cm^3$ at the interface with the n+ conductivity type semiconductor region 28 and the depth thereof is about 0.5 μm. The junction breakdown voltage at this time exceeds 18 V.

The second interlayer oxide layer 30 is made of phospho-silicate glass (PSG) and covers the principal surface of the p− conductivity type semiconductor substrate 21. The contact hole 31 is formed by removing partly the second interlayer oxide layer 30 and the gate oxide layer 12 over the drain region.

Although it is omitted in FIG. 4, there is disposed a protection layer consisting of a PSG layer and a silicon nitride layer disposed thereon, on the data line 32 made of aluminium.

Now, referring to FIG. 2, the outline of the operation of the non-volatile semiconductor memory device according to this embodiment, which consists of a memory array, in which the above described FAST type memory elements are arranged in an array, and peripheral circuits will be explained.

Figure 2:
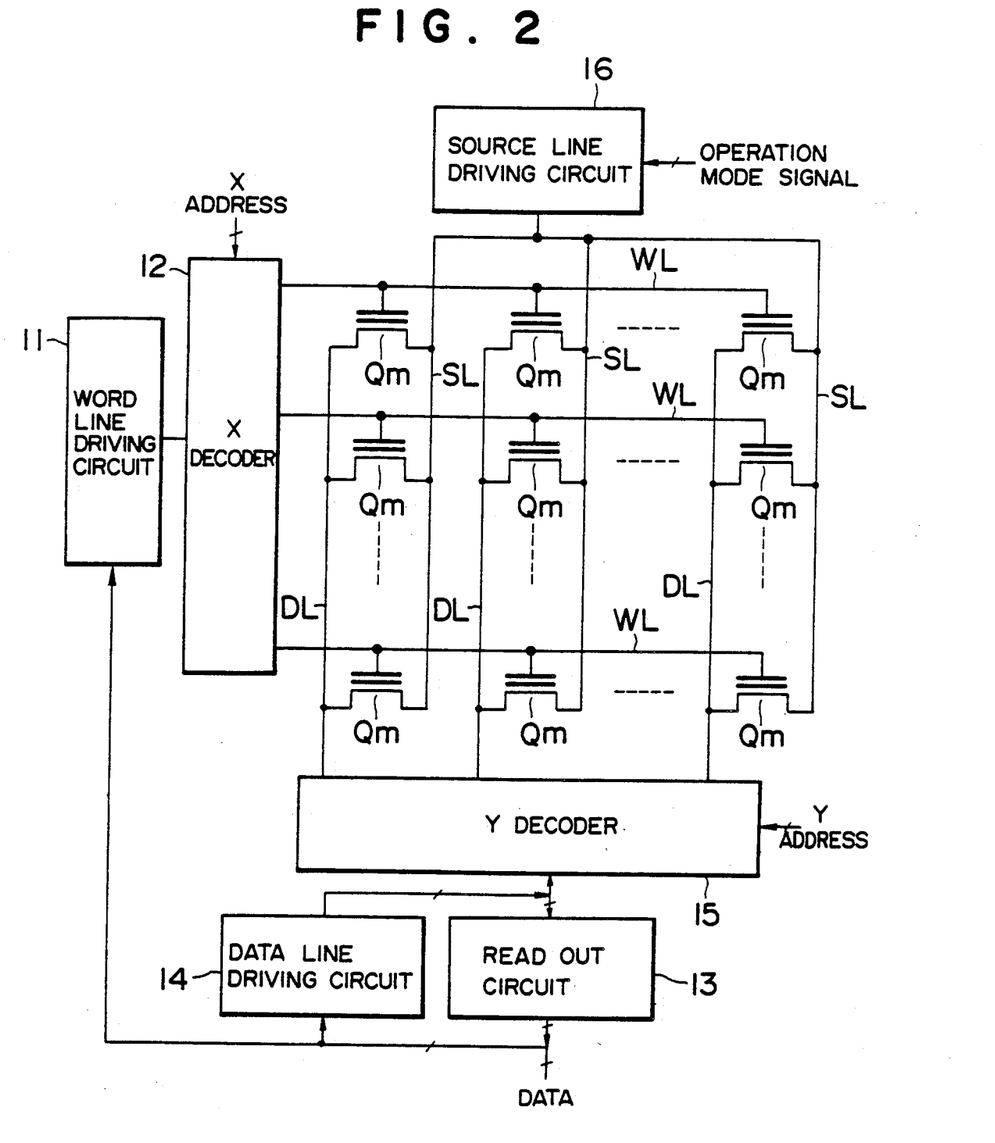
FIG. 2 is a circuit block diagram for explaining the operation of the non-volatile semiconductor memory device in Embodiment.

In FIG. 2, reference numeral 11 is a circuit driving word lines WL; 12 is an X decoder selecting a word line; 13 is a read out circuit; 14 is a circuit driving data lines DL; 15 is a Y decoder selecting a data line DL; and 16 is a circuit driving source lines SL. Qm represents an FAST type memory element, which consists of one insulated gate field effect transistor having a floating gate electrode, a control gate electrode, a source region, a drain region and a channel region. The control gate electrode is connected with the word line WL. Further the drain region and the source region are connected with the data line DL and the source line SL, respectively.

The programming operation is effected bit by bit, utilizing the channel hot electron injection phenomenon. Concretely speaking, in the state where all the source lines are grounded, by applying the programming drain voltage $V_p(D)$ (e.g. 6 V) to a selected data line DL and similarly the programming gate voltage $V_p(G)$ (e.g. 12.5 V) to a selected word line WL, the memory element, which is at the intersection of the two lines, is programmed.

The reading operation is effected, similarly to the programming operation, bit by bit, by detecting the threshold voltage of the memory element corresponding to the presence or absence of information charge (electrons) on the floating gate electrode as magnitude (presence or absence) of the channel current. That is, in the state where all the source lines SL are grounded, by applying the reading drain voltage $V_r(D)$ (e.g. 1 V) to a selected data line DL and similarly the reading gate voltage $V_r(G)$ (e.g. 5 V) to a selected word line WL, it is possible to read out information stored in the memory element, which is at the intersection of the two lines.

In order that the programming and the reading operation can be effected normally, it is paramount that the threshold voltage of the memory element is never in the depletion state (i.e. in this embodiment it is never negative). If there are some memory elements in the depletion state, it is not possible to select the desired memory element, since leakage currents fatal to the normal programming and reading operations flow through the depleted memory elements. This means that when the threshold voltage of the memory element is varied from the high level to the low level in the erasing operation, the controllability of the operation has an extremely important meaning.

Now the erasing operation, which is a problem of this invention, is effected by drawing out information charge (electrons) held in the floating gate electrode to the source region by the Fowler-Nordheim Tunnel emission. Concretely speaking, the erasing operation is effected by applying the erasing voltage $V_e(S)$ (e.g. 12.5 V) from the source line driving circuit 16 to the source lines SL, in the state where all the X decoder outputs are indicative of a non-selected state condition, that is, all the word lines WL are grounded. At this time, since all the source lines are connected with the source line driving circuit 16 not through the decoder but directly, the erasing operation is effected simultaneously for all the memory elements in the memory array. On the other hand, concerning the data lines DL, each of them is placed separately in an electrically open state at the Y decoder. In this way useless or unnecessary channel current flow from the source region to the drain region is prevented, following the progress of the erasing operation.

Next the waveform of the erasing voltage applied by the source line driving circuit 16 at chip-erase operation described above will be explained, referring to FIGS. 1(a), 1(b) and 1(c).

Figure 1A:
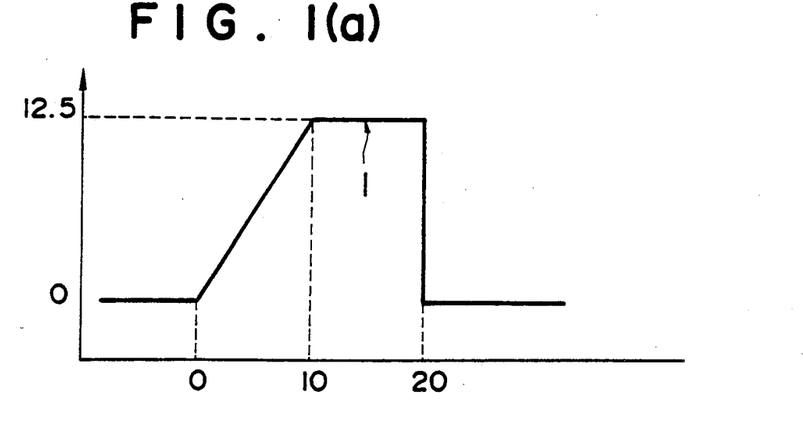
FIGS. 1(a), 1(b) and 1(c) show driving voltage waveforms on a source line for effecting a chip-erase operation in Embodiment.
Figure 1B:
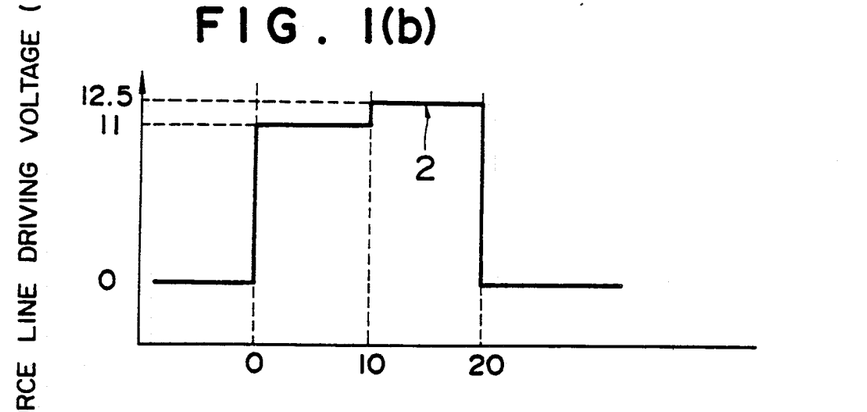
Figure 1C:
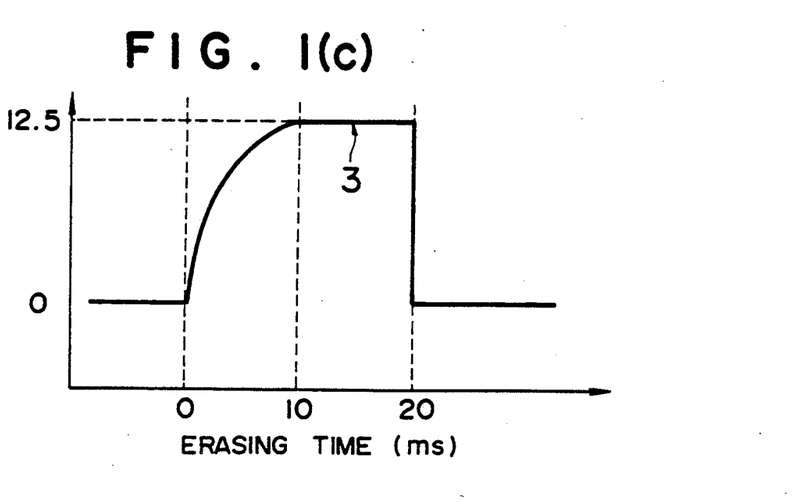

In this embodiment, in order to prevent an excessive electric field from being generated at the tunnel oxide layer and at the surface of the source region at the beginning of the erasing operation, which gives rise to injection of an excessive amount of holes, instead of the prior art method, by which a predetermined erasing voltage of 12.5 V is applied instantaneously to the source line SL, a method is executed, by which firstly an erasing voltage lower than the prior art erasing voltage is applied during a predetermined period of time to effect a preliminary erasing operation and afterward the necessary main erasing operation is effected. In FIGS. 1(a) and 1(c), the rise of the erasing voltage is linear and exponential, respectively, so that the preliminary erasing is effected in this rising period (0–10 ms). In FIG. 1(b), a constant voltage, which is lower by 1.5 V than the predetermined voltage of 12.5 V, is applied for 10 ms, during which the preliminary erasing operation is effected.

FIGS. 6, 7(a), 7(b) and 8 show excellent effects of this embodiment to improve the controllability and the reliability of the erasing operation.

Figure 6:
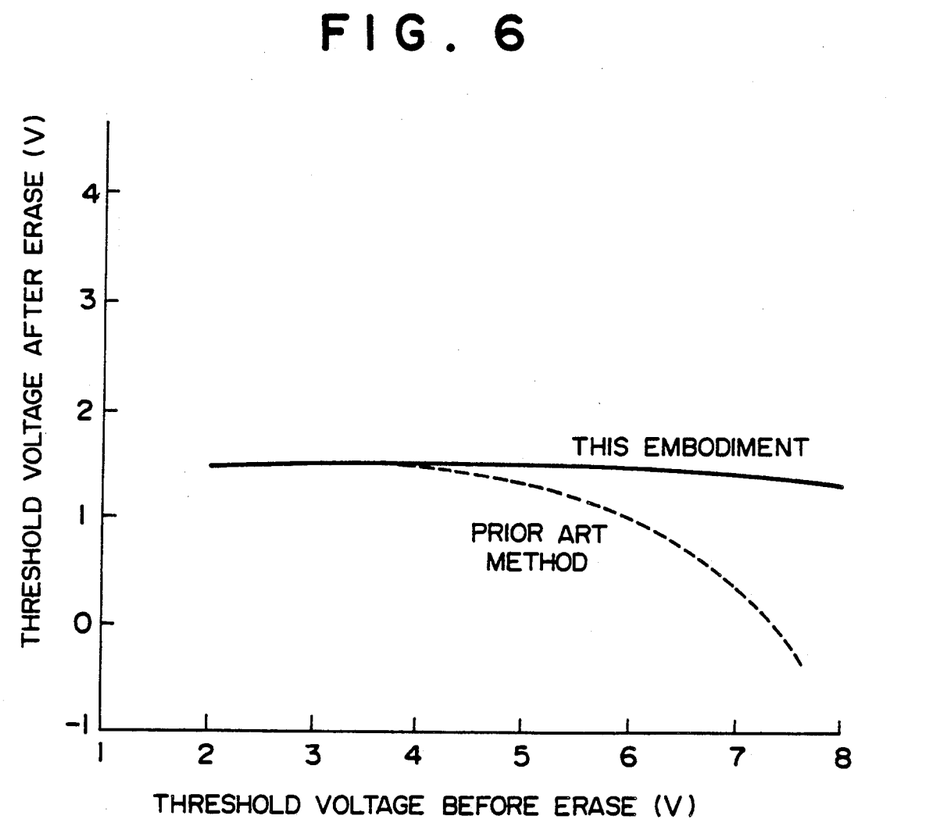
FIGS. 6, 7(a) and 7(b) are schemes for explaining the effect to improve the controllability of the erasing operation in Embodiment.

FIG. 6 shows the relation between the threshold voltage before the erase operation (threshold voltage at the high level) and the threshold voltage after the erase operation is completed (threshold voltage at the low level) of a memory element. The abscissa indicates the threshold voltage before the erase operation; and the ordinate the threshold voltage after the erase operation; the full line representing a result of this embodiment the broken line representing that obtained by the prior art method described above.

By the prior art method, by which the predetermined erasing voltage of 12.5 V is applied instantaneously to the source line SL, a peculiar phenomenon appears in that the threshold voltage after the erase operation is completed decreases with an increasing threshold voltage before the erase operation, even if the erasing operation is effected under constant conditions. This is because, since the potential of the floating gate electrode at the beginning of the erase operation decreases with an increasing threshold voltage before the erase, excessive electric field concentration takes place and together therewith influences of the hole injection appear significantly. Here influences appear in the region, where the threshold voltage before erase is over 4 V. In this case, if there is scattered distribution in the threshold values before the erase operation is effected of the memory elements within the memory array, since the threshold value after the chip-erase operation fluctuates also, it is extremely difficult to prevent all the memory elements from going depletion, while effecting satisfactorily the erasing operation in all the memory elements.

On the contrary, in this embodiment, in which the preliminary erasing operation is effected by using a voltage lower than the predetermined erasing voltage, if the erasing operation is effected under constant conditions, the threshold value after the erase operation is effected has an approximately constant value, independently of the threshold value before the erase operation. That is, even if the threshold voltage before the erase operation may scatter considerably, it is possible at the chip-erase operation to control the threshold value of all the memory elements within the memory array with a high precision.

Figure 9:
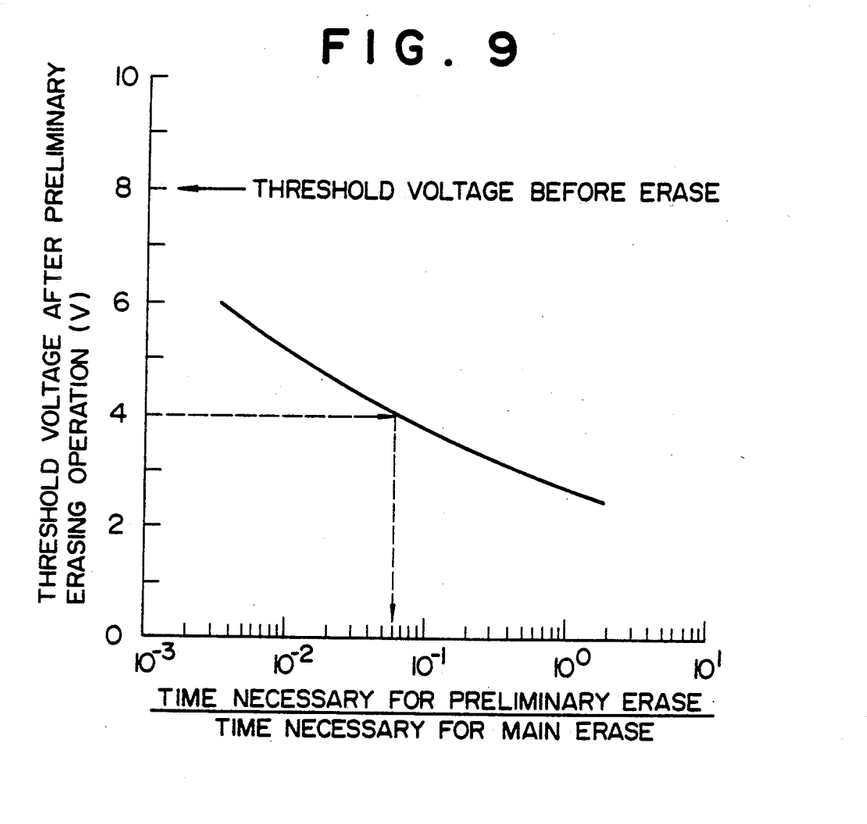
FIG. 9 is a scheme for explaining influences of the preliminary erasing operation on the whole of the erasing speed.

The effect of the preliminary phase of the erase operation is due to the fact that since the threshold voltage is decreased to a value below 4 V during preliminary erase phase of operation, hole injection is avoided in the course of the main erase phase of operation following it. FIG. 9 shows at least how much time is necessary for the preliminary erasing operation, taking the case of the rise according to an exponential function as an example. The abscissa represents the ratio of the time necessary for the preliminary erase to the time necessary for the main erase until the termination of the erasing operation and the ordinate the threshold voltage after the preliminary erasing operation. It can be seen that the effect of the preliminary erase is held, even if the ratio of the preliminary erase to the time of the main erase is reduced below 10%. In general, the lower limit of the ratio stated above may vary, depending on the structure of the memory cell and the applied voltage used for the main erase. Consequently it is preferable to obtain the lower limit for various cases and to suppress the influences of the introduction of the preliminary erase on the whole of the erasing speed as far as possible.

Figure 7A:
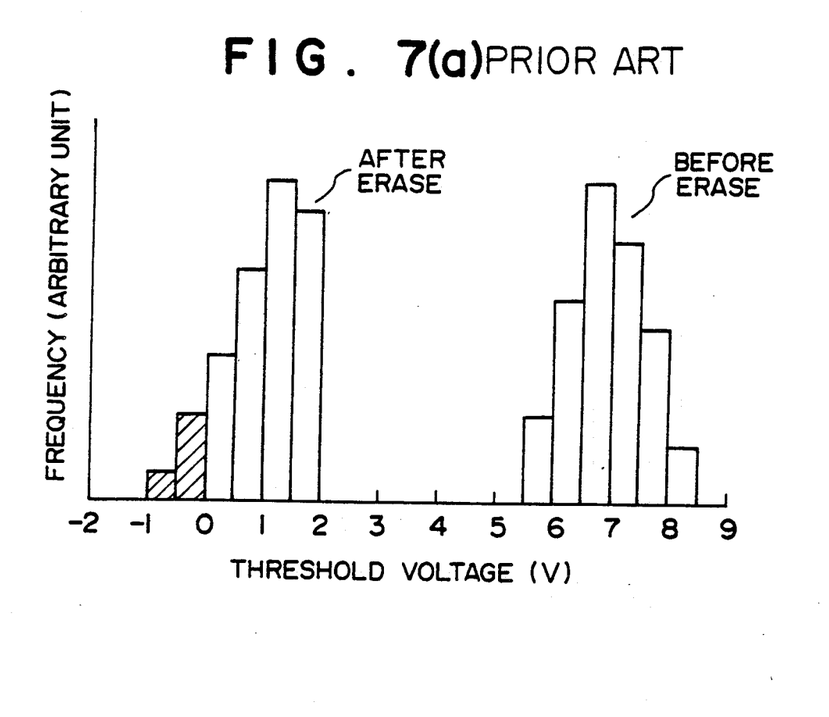
Figure 7B:
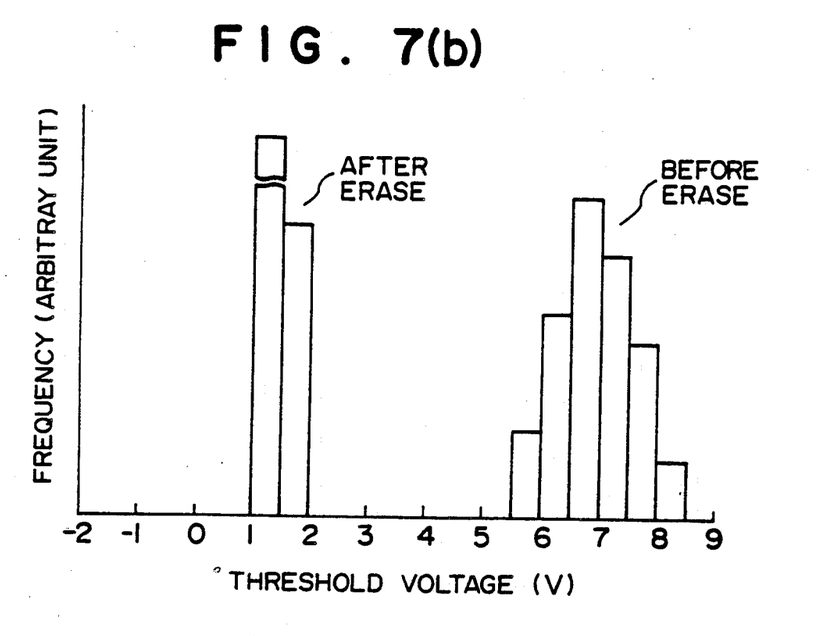

FIGS. 7(a) and 7(b) show distribution of the threshold voltage of all the memory elements within the memory array after the chip-erase operation is completed. In order to secure an operation margin in the reading operation, chip-erase conditions were so set that the maximum value of the threshold voltage after the erase is lower than 2.0 V. At this time, by the prior art method indicated in FIG. 7(a) a part of memory elements are in the depletion state (where the threshold voltage is negative). On the contrary, according to this invention indicated in FIG. 7(b) the threshold voltage is controlled so as to be between 1 V and 2 V and no fatal depletion state is produced. That is, owing to this embodiment, the chip-erase operation for a memory array using FAST type memory elements has been made possible for the first time.

Figure 8:
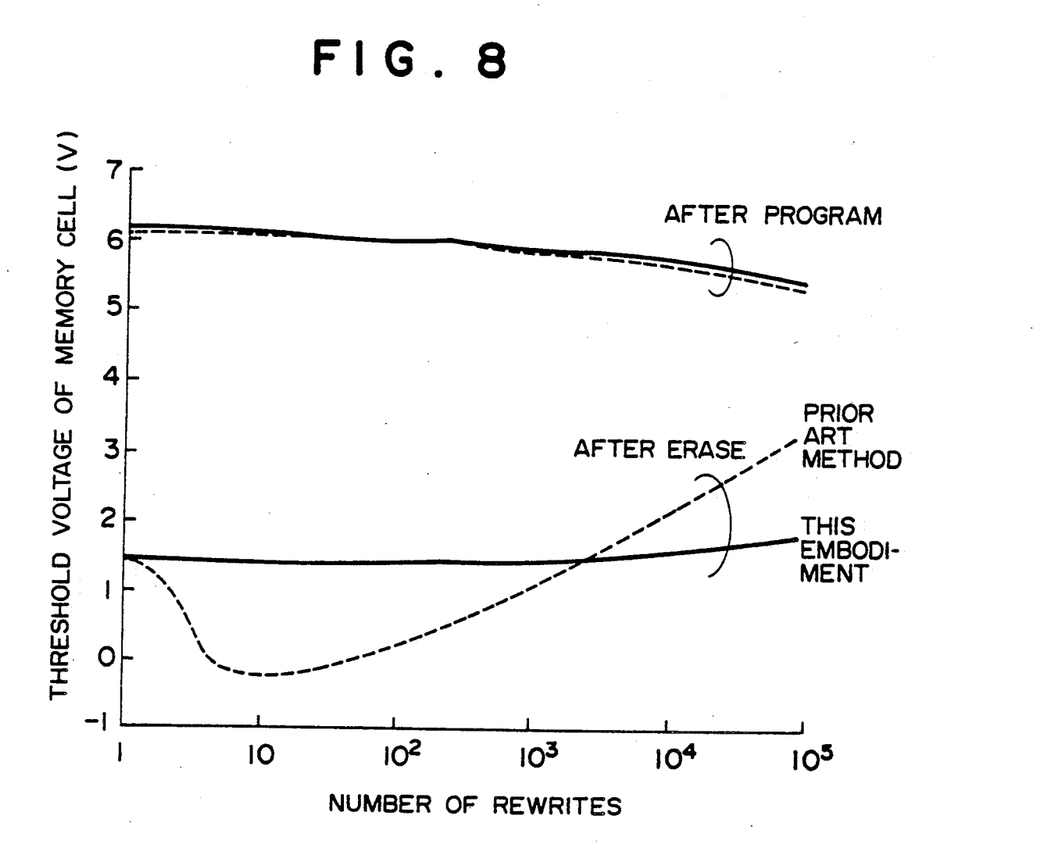
FIG. 8 is a scheme for explaining the effect to improve the effect to improve the reliability for the repetition of the rewrite in Embodiment.

FIG. 8 shows how stable the value of the threshold voltage remains after each of the programming and erasing operations, when they are effected repeatedly under constant conditions, the abscissa representing the number of rewrites. Full lines in the figure represent results of this embodiment and broken lines represent those obtained by the prior art method.

The effect of this embodiment can be seen in the stability of the threshold voltage after the erase operation. According to the prior art method, up to number of rewrites of about 10, the threshold voltage after the erase is shifted remarkably towards negative and further fluctuations due to electron trap thereafter are also significant. On the contrary according to this embodiment, a stable threshold voltage after the erase operation can be obtained, even if the number of rewrites exceeds $10^4$ and thus the reliability for the rewriting operation is extremely high.

Figure 3:
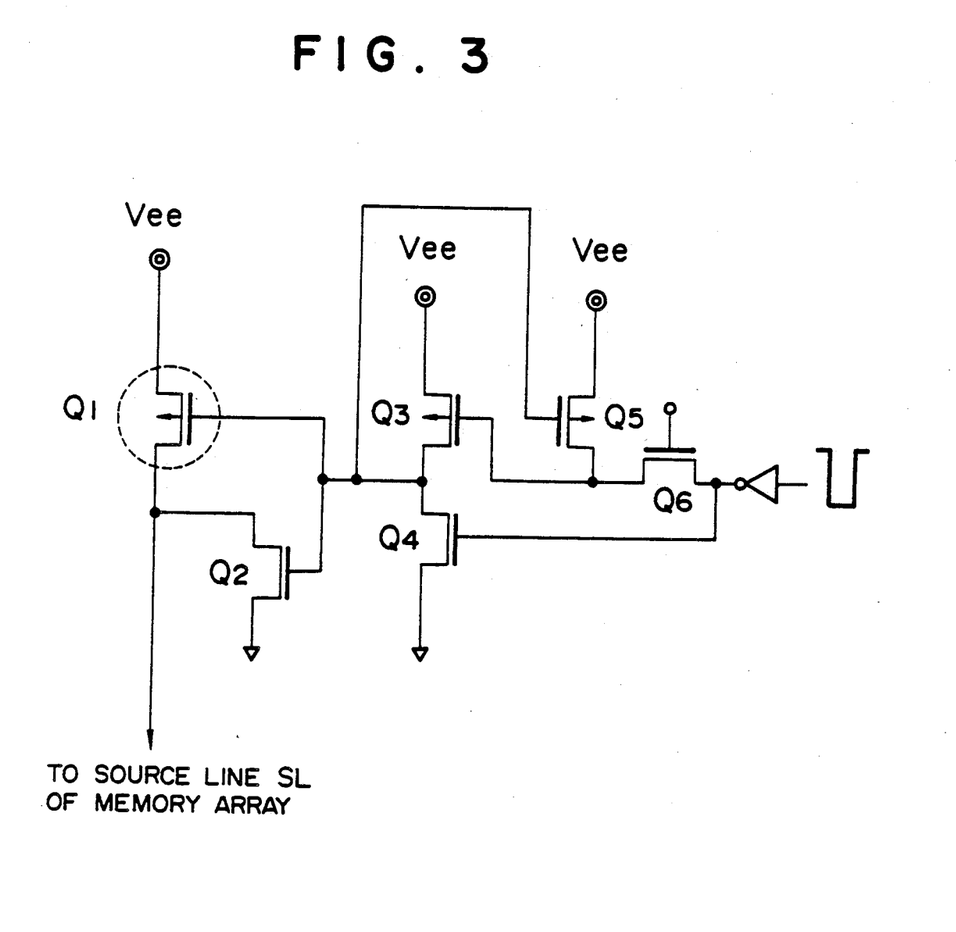
FIG. 3 shows an example of a source line driving circuit in Embodiment using the voltage drop due to the leakage current from the source to the substrate at a chip-erase operation.

FIG. 3 shows an example of the source line driving circuit having an action to round or curve the rise of the erasing voltage applied to the source line SL in an approximately exponential manner. This circuit utilizes the fact that the leakage current flowing from the source to the substrate at the erasing operation is greatest at the beginning of the erase operation and decreases rapidly with progression of the erase operation. The leakage current described above results in the rounding or curving of the rise of the erasing voltage by the voltage drop produced in the p channel MOS transistor Q1. In order to realize a desired rise, W/L, i.e. the effective resistance R(eff) of Q1 is set, depending on the leakage current of the whole memory array, in which the chip-erase operation is to be effected.

Figure 10:
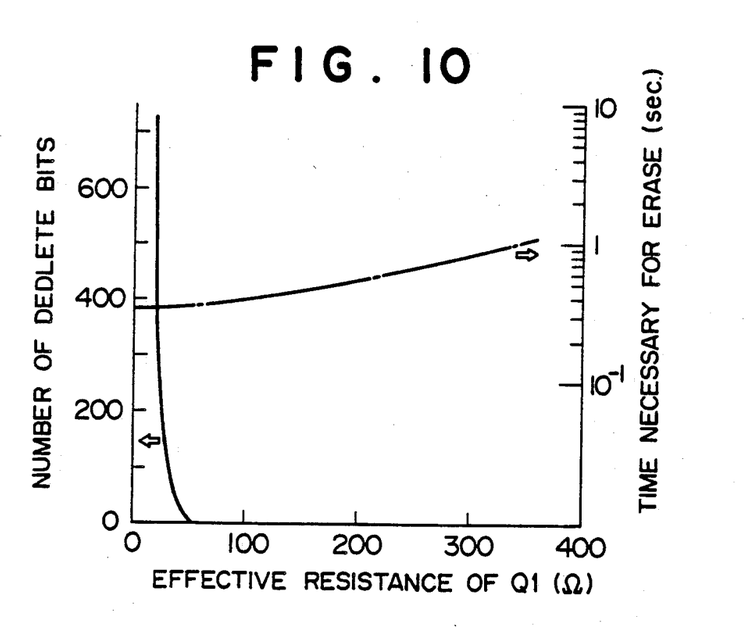
FIG. 10 is a scheme for explaining the optimum condition for the source line driving circuit.

FIG. 10 shows the relation between the value of R(eff) stated above and the effect of the preliminary erase phase of the erase operation, taking the case where the chip-erase is effected in a memory array of 1M bit as an example. In this example the effect of the preliminary erase phase appears by increasing R(eff) above 55Ω for an erasing voltage of 12 V, that is, the generation of deplete bits after the chip-erase operation is completely suppressed. In general, the lower limit of R(eff) to obtain the effect of the preliminary phase of the erase can vary operation depending upon the structure of the memory cell, the scale of the memory array, the distribution of the threshold voltage before the erase operation within the array, the leakage current determined by the erasing voltage used for the main erase, and the level at which the erase operation ends. Consequently it is necessary to obtain the smallest R(eff), under which no generation of deplete bits is found any more, and to set a value having a margin thereto. On the other hand, there is a tendency that the time necessary for the erase operation, increases with an increasing R(eff). Therefore, in practice, it is preferable to set R(eff) at a value of about 1.5 to 3 times as great as the minimum value described above. In the case where the chip-erase operation is effected in a memory array of 1M bits, as described above, the lower limit of R(eff) is set at 80Ω, leaving a margin for fluctuations, and the upper limit is 180Ω, based on a specification that the erasing time should be shorter than 500 ms. Therefore the design window of R(eff) is a region from 80 to 180Ω.

Although, in the embodiment described above, the case where an n channel type transistor is used as the insulated gate field effect transistor constituting a memory element has been described, in the case where the memory element is constituted by an opposite conductivity type, i.e. p channel type transistor, the erasing operation is effected by applying a negative voltage to the source lines SL. It is a matter of course that this invention is efficient also in this case.

As explained above, according to this invention, in a non-volatile semiconductor memory device having a memory array consisting of FAST type memory elements it is possible to improve the controllability of the chip-erase operation and the reliability for a number of repetitions of the rewriting operation. As the result it is possible to realize a non-volatile semiconductor memory (flash E$^2$PROM) having a so large capacity as EPROM erasable by ultraviolet, and chip-erasable (or block-erasable) in an electric manner, which is excellent in the reliability.

We claim:

1. A non-volatile semiconductor memory device comprising:

a gate insulating layer disposed on a principal surface of a semiconductor substrate;

a floating gate electrode disposed on said gate insulating layer;

a control gate electrode disposed on said floating gate electrode through an interlayer insulating layer;

a source region and a drain region disposed in said semiconductor substrate near said principal surface and being spaced-apart from each other, at least one of which has a portion which has superposed thereon said floating gate electrode through said gate insulating layer;

a channel region being effected between said source region and said drain region, the part of said gate insulating layer which is on the superposed portion and that which is on said channel region adjacent thereto have a thickness which is substantially the same;

means for erasing electrically positive or negative information charge held in said floating gate electrode, said erasing being effected by applying a predetermined electric field to said gate insulating layer so as to transfer by tunneling said information charge from said floating gate electrode to one of said source and drain regions; and means for substantially preventing occurrence of charge injection, of charge having a polarity opposite to that of said information charge, from said source region to said gate insulating layer upon occurrence of an electrical erase operation, the injection preventing means including, means for applying a predetermined voltage to one of said source and drain regions, said predetermined voltage having such a polarity that said region is reversely biased with respect to said semiconductor substrate, means for applying a voltage having the same polarity as said predetermined voltage, but with a relatively smaller absolute value therefrom, to said one of said source and drain regions before the application of said predetermined voltage thereto, and means for grounding said control electrode.

2. A non-volatile semiconductor memory device, in which insulated gate field effect transistors are arranged in an array, each of said insulated gate field effect transistors comprising:

a gate insulating layer disposed on a principal surface of a semiconductor substrate;

a floating gate electrode disposed on said gate insulating layer;

a control gate electrode disposed on said floating gate electrode through an interlayer insulating layer;

a source region and a drain region disposed in said semiconductor substrate near said principal surface and being spaced-apart from each other, at least one of which has a portion which has superposed thereon said floating gate electrode through said gate insulating layer;

a channel region being effected between said source region and said drain region, the part of said gate insulating layer which is on said superposed portion and that which is on said channel region adjacent thereto having a thickness which is substantially the same;

power source means for applying an erasing voltage to an erasing line through a switch comprised of another insulated gate field effect transistor and serving as means which generates an electric field having a part having the same direction but with a smaller absolute value at the beginning of application of said erasing voltage, wherein information stored in the whole array is erased simultaneously by applying said voltage, having such a polarity that at least one of said source region and said drain region having the portion which has superposed thereon said floating gate electrode is reversely biased with respect to said substrate, to said erasing line connecting all said regions in common in the whole array; and means for grounding said control electrode.

3. A non-volatile semiconductor memory device according to claim 1, wherein a ratio of time necessary for effecting a preliminary phase of an erasing operation to a time necessary for a main phase of an erasing operation is so determined that a threshold voltage resulting after the preliminary phase of said erasing operation has ended becomes under four volts.

4. A non-volatile semiconductor memory device according to claim 2, wherein a ratio of time necessary for effecting a preliminary phase of an erasing operation to a time necessary for a main phase of an erasing operation is so determined that a threshold voltage resulting after the preliminary phase of said erasing operation has ended becomes under four volts.

* * * * *